United States Patent
Lee et al.

(10) Patent No.: US 8,631,377 B2
(45) Date of Patent: Jan. 14, 2014

(54) SYSTEM AND METHOD FOR DESIGNING CELL ROWS WITH DIFFERING CELL HEIGHTS

(75) Inventors: Yun-Han Lee, Baoshan Township (TW); Wu-An Kuo, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 305 days.

(21) Appl. No.: 12/707,347

(22) Filed: Feb. 17, 2010

(65) Prior Publication Data

US 2010/0289111 A1 Nov. 18, 2010

Related U.S. Application Data

(60) Provisional application No. 61/178,287, filed on May 14, 2009.

(51) Int. Cl.
*G06F 17/50* (2006.01)

(52) U.S. Cl.
USPC .................. 716/124; 716/119; 716/125

(58) Field of Classification Search
USPC .................. 716/119, 122, 124, 118
See application file for complete search history.

(56) References Cited

U.S. PATENT DOCUMENTS

| | | | |
|---|---|---|---|
| 5,768,146 A * | 6/1998 | Jassowski | 716/120 |
| 6,591,407 B1 | 7/2003 | Kaufman et al. | |
| 6,769,110 B2 | 7/2004 | Katoh et al. | |
| 7,685,540 B1 * | 3/2010 | Madden et al. | 716/135 |
| 7,802,219 B2 * | 9/2010 | Tomar et al. | 716/119 |
| 2006/0138464 A1 * | 6/2006 | Shimamura | 257/204 |
| 2007/0290270 A1 | 12/2007 | Ko et al. | |
| 2008/0016483 A1 * | 1/2008 | Chan | 716/11 |
| 2008/0073673 A1 * | 3/2008 | Shiga | 257/211 |
| 2008/0120588 A1 | 5/2008 | Becker | |
| 2009/0033368 A1 * | 2/2009 | Pitts | 326/101 |
| 2010/0162187 A1 * | 6/2010 | Penzes et al. | 716/2 |

* cited by examiner

*Primary Examiner* — Fernando L Toledo
*Assistant Examiner* — Peter Bradford
(74) *Attorney, Agent, or Firm* — Slater & Matsil, L.L.P.

(57) ABSTRACT

A system and method for designing integrated circuits is disclosed. An embodiment comprises placing a standard cell with a first cell height into a cell row with a different height. The standard cell may have a height smaller than the cell row or else may have a height that is larger than the cell row. Vertical fillers and horizontal fillers are utilized to extend and connect the standard cell to adjacent cells without having to redesign the entire cell row.

20 Claims, 11 Drawing Sheets

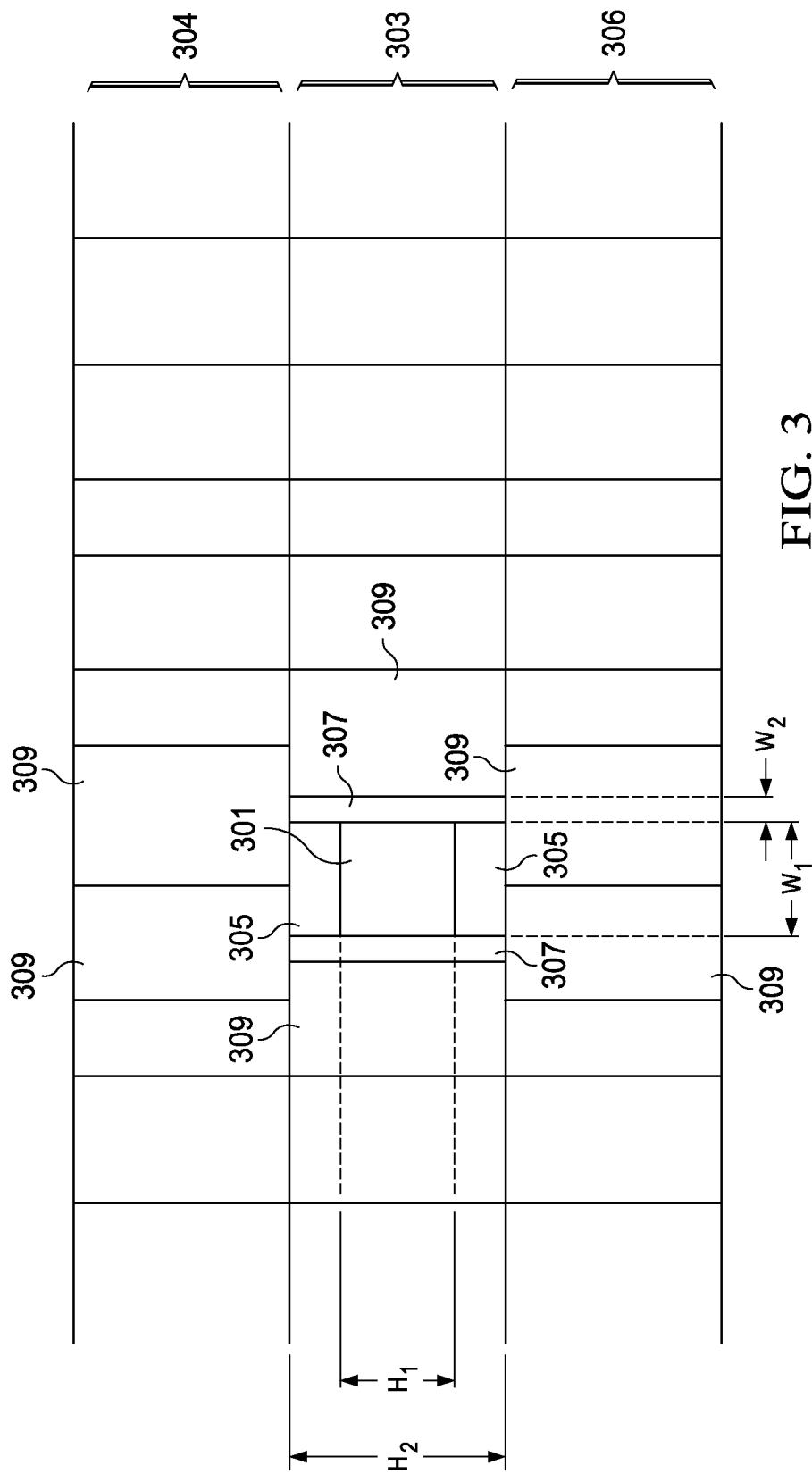

SYSTEM AND METHOD FOR DESIGNING CELL ROWS WITH DIFFERING CELL HEIGHTS

This application claims the benefit of U.S. Provisional Patent Application Ser. No. 61/178,287, filed on May 14, 2009, and entitled "System and Method for Designing Cell Rows," which application is incorporated herein by reference.

TECHNICAL FIELD

The present invention relates generally to a system and method for designing integrated circuit layouts, and more particularly to a system and method for placing differently sized cells into cell rows.

BACKGROUND

Generally, electronic design automation (EDA) tools assist semiconductor designers to take a purely behavioral description of a desired circuit and work to fashion a finished layout of the circuit ready to be manufactured. This process usually takes the behavioral description of the circuit and turns it into a functional description, which is then decomposed into thousands of Boolean functions and mapped into rows of cells using a standard cell library. Once mapped, a synthesis is performed to turn the structural design into a physical layout, a clock tree is built to synchronize the structural elements, and the design is optimized post layout.

Generally, in order to avoid problems with aligning the cells from the library with common power rails or other design rules, a standardized cell from a cell library is used which has either a cell height equal to the height of the cell row or else has a cell height that is a multiple of the standard cell height. As such, typically a decision is made early on as to which cell height to utilize for the design, and the cell library corresponding to that cell height is used for the structural design and synthesis processes.

However, by using only a single cell height, some compromises between circuit performance, circuit power, and the manufacturing process must be made. For example, cells with a low threshold voltage have relatively high speed and power but, also require an extra masking step during manufacturing. Alternatively, cells with a relatively high threshold voltage design may use a lower amount of power, but also has a low speed when compared to the low threshold voltage, while still requiring an extra mask. Compromise cell sizes, which would give a threshold voltage between the low threshold voltage and the high threshold voltage, merely split the differences, supplying a medium speed and a medium power, but not requiring an extra mask. As such, these compromises limit the performance, power, and manufacturing options that may otherwise be used to design smaller, faster, and more power efficient designs.

SUMMARY OF THE INVENTION

These and other problems are generally solved or circumvented, and technical advantages are generally achieved, by preferred embodiments of the present invention which provide for a system and method to place standard cells with different cell heights into a single cell row.

In accordance with a preferred embodiment of the present invention, an integrated circuit comprises a first plurality of cells located in a first row having a first height. A first cell of the first plurality of cells has a second height different from the first height and different from an integer multiple of the first height. One or more extension regions are located adjacent the first cell, and the one or more extension regions connect the first cell to adjacent cells.

In accordance with another preferred embodiment of the present invention, an integrated circuit design implementation system comprises a processor that accesses one or more electronic libraries of standard cells. The one or more electronic libraries comprise a first cell with a first cell height and a second cell with a second cell height different from the first cell height and different from an integer multiple of the first cell height. A place and route tool combines the first cell and the second cell into a first cell row by adding one or more extension regions to the second cell.

In accordance with yet another preferred embodiment of the present invention, an integrated circuit design implementation system comprises a memory for storing a first electronic library with a first cell having a first cell height and a second electronic library with a second cell having a second cell height different from the first cell height or double the first cell height. A synthesis tool is used to synthesize a circuit design, and a place and route tool is used to generate a layout of the synthesized circuit design by adding extension regions to the second cell and placing the second cell and the first cell in a first cell row with the extension regions connecting the first cell to the second cell.

An advantage of a preferred embodiment of the present invention is the flexibility that the system has in choosing appropriately sized cells for the desired efficiency and speed requirements without having to redesign whole sections of cell rows for differently sized cells.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3 and 4A-4D illustrate the placement of a small cell into a larger cell row in accordance with an embodiment of the present invention.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an electronic design automation (EDA) program that can place cells of varying height into the same cell row. The invention may also be applied, however, to other methods of design.

Figure 1:
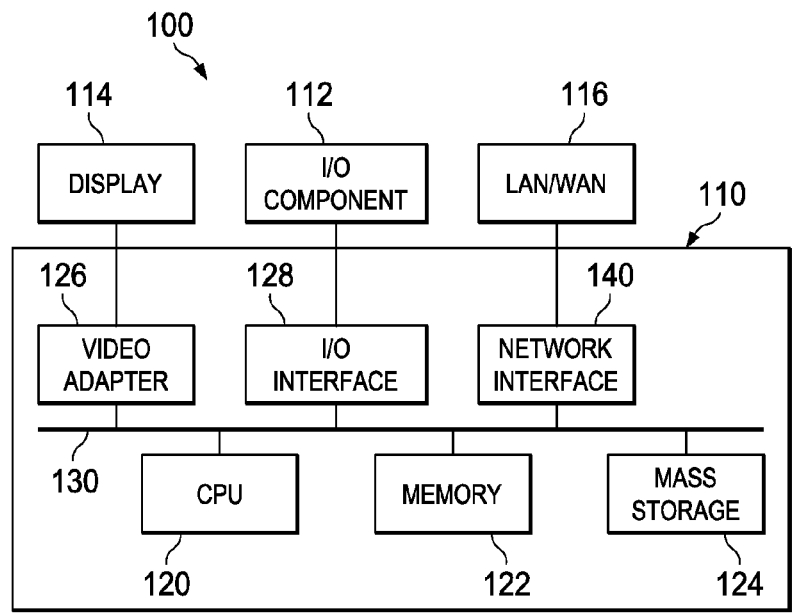
FIG. 1 illustrates a processing system in accordance with an embodiment of the present invention.

Referring now to FIG. 1, a block diagram of a processing system 100 is provided in accordance with an embodiment of the present invention. The processing system 100 is a general purpose computer platform and may be used to implement any or all of the processes discussed herein. The processing system 100 may comprise a processing unit 110, such as a desktop computer, a workstation, a laptop computer, or a dedicated unit customized for a particular application. The processing system 100 may be equipped with a display 114 and one or more input/output devices 112, such as a mouse, a keyboard, or printer. The processing unit 110 may include a central processing unit (CPU) 120, memory 122, a mass storage device 124, a video adapter 126, and an I/O interface 128 connected to a bus 130.

The bus 130 may be one or more of any type of several bus architectures including a memory bus or memory controller, a peripheral bus, or video bus. The CPU 120 may comprise any type of electronic data processor, and the memory 122 may comprise any type of system memory, such as static random access memory (SRAM), dynamic random access memory (DRAM), or read-only memory (ROM).

The mass storage device 124 may comprise any type of storage device configured to store data, programs, and other information and to make the data, programs, and other information accessible via the bus 130. The mass storage device 124 may comprise, for example, one or more of a hard disk drive, a magnetic disk drive, an optical disk drive, or the like.

The video adapter 126 and the I/O interface 128 provide interfaces to couple external input and output devices to the processing unit 110. As illustrated in FIG. 1, examples of input and output devices include the display 114 coupled to the video adapter 126 and the I/O device 112, such as a mouse, keyboard, printer, and the like, coupled to the I/O interface 128. Other devices may be coupled to the processing unit 110, and additional or fewer interface cards may be utilized. For example, a serial interface card (not shown) may be used to provide a serial interface for a printer. The processing unit 110 also may include a network interface 140 that may be a wired link to a local area network (LAN) or a wide area network (WAN) 116 and/or a wireless link.

It should be noted that the processing system 100 may include other components. For example, the processing system 100 may include power supplies, cables, a motherboard, removable storage media, cases, and the like. These other components, although not shown, are considered part of the processing system 100.

In an embodiment of the present invention, an EDA is program code that is executed by the CPU 120 to analyze a user file to obtain an integrated circuit layout (described further below with respect to FIG. 2). Further, during the execution of the EDA, the EDA may analyze functional components of the layout, as is known in the art. The program code may be accessed by the CPU 120 via the bus 130 from the memory 122, mass storage device 124, or the like, or remotely through the network interface 140.

Figure 2:
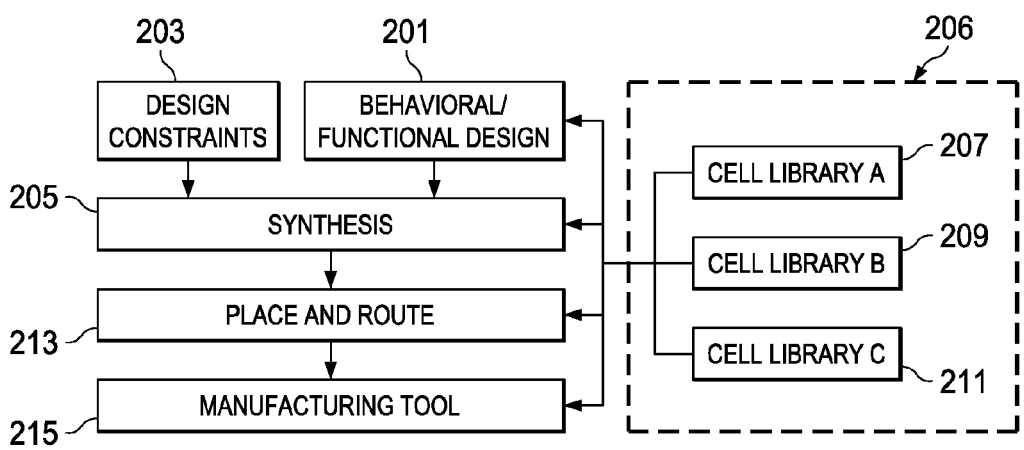
FIG. 2 illustrates a flow diagram to generate a physical layout of an integrated circuit in accordance with an embodiment of the present invention.

FIG. 2 illustrates one possible flow used by the EDA in an embodiment of the present invention to automatically generate a physical layout from a user supplied behavioral/functional design 201. The behavioral/functional design 201 specifies the desired behavior or function of the circuit based upon various signals or stimuli applied to the inputs of the overall design, and may be written in a suitable language, such as a hardware description language (HDL). The behavioral/functional design 201 may be uploaded into the processing unit 110 (see FIG. 1) through the I/O interface 128, such as by a user creating the file while the EDA is executing. Alternatively, the behavioral/functional design 201 may be uploaded and/or saved on the memory 122 or mass storage device 124, or the behavioral/functional design 201 may be uploaded through the network interface 140 from a remote user (see FIG. 1). In these instances, the CPU 120 will access the behavioral/functional design 201 during execution of the EDA.

Additionally, the user also provides a set of design constraints 203 in order to constrain the overall design of the physical layout of the behavioral/functional design 201. The design constraints 203 may be input, for example, through the I/O interface 128, downloading through the network interface 140, or the like. The design constraints 203 may specify timing and other suitable constraints with which the behavioral/functional design 201, once physically formed into an integrated circuit, must comply.

The EDA takes the behavioral/functional design 201 and the design constraints 203 and performs a synthesis 205 to create a functionally equivalent logic gate-level circuit description, such as a netlist. The synthesis 205 forms the functionally equivalent logic gate-level circuit description by matching the behavior and/or functions desired from the behavioral/functional design 201 to standard cells from cell libraries 206, which meet the design constraints 203.

The cell libraries 206 may include one or more individual cell libraries, such as cell library A 207, cell library B 209, or cell library C 211. Each of the individual cell libraries contains a listing of pre-designed components, called cells, each of which may perform a discrete logic function on a small scale. The cell is stored in the individual cell libraries (such as cell library A 207, cell library B 209, or cell library C 211) as information comprising internal circuit elements, the various connections to these circuit elements, a pre-designed physical layout pattern that includes the height of each cell along with the cells' designed power rails, dopant implants, wells, and the like. Additionally, the stored cell may also comprise a shape of the cell, terminal positions for external connections, delay characteristics, power consumption, and the like.

In this embodiment, each of the individual cell libraries (such as cell library A 207, cell library B 209, or cell library C 211) contain cells with the same cell heights. For example, each of the cells in cell library A has a common cell height, while each of the cells in cell library B also has a common cell height that is different from the common cell height cell library A. Alternatively, the cells may all be stored in the same library or some other suitable configuration of storage.

The cell heights in these libraries may be measured by the number of metal wires (or tracks) that may be routed through the cell parallel to each other. For example, the cells in cell library A may all have a cell height of 12 tracks, or 12 metal wires routed through the cell parallel to each other, while the cells in cell library B may all have a cell height of 9 tracks, or 9 metal wires routed through the cell parallel to each other. Accordingly, while the actual dimensions of an individual track may be dependent upon the process node utilized (e.g., 90 nm process node, 65 nm process node, etc.), for a 65 nm low power (LP) process node a single track would be equivalent to about 0.2 μm.

This availability of different cell heights (and the cell's corresponding component dimensions) allows the synthesis tool to choose the cells that best suit the performance characteristics (e.g., power consumption, speed, etc.) required by the behavioral/functional design 201 within the limits of the design constraints 203, thereby allowing for better efficiency of the overall design.

Once the synthesis 205 creates the functionally equivalent logic gate-level circuit description from the behavioral/functional design 201 and the design constraints 203 by using one or more of the cell libraries 206, a place and route 213 is performed to create an actual physical design for the overall structure. The place and route 213 forms the physical design by taking the chosen cells from the cell libraries 206 and placing them into cell rows (such as cell row 303 described below with respect to FIG. 3). These cell rows generally have a row height similar to the height of a majority of the individual cells located within that cell row such that the power rails, implants and wells may be aligned between the individual cells. The placement of each individual cell within the cell rows, and the placement of each cell row in relation to other cell rows, may be guided by cost functions in order to minimize wiring lengths and area requirements of the resulting integrated circuit. This placement may be done either automatically by the place and route 213, or else may alternatively be performed partly through a manual process, whereby a user may manually insert one or more cells into a row.

Once a physical design layout has been generated by the place and route tool 213, the physical design may be sent to a manufacturing tool 215 to generate, e.g., photolithographic masks, that may be used in the physical manufacture of the desired design. The physical design layout may be sent to the manufacturing tool 215 through that LAN/WAN 166 or other suitable forms of transmission from the EDA to the manufacturing tool 215.

Figure 4A:
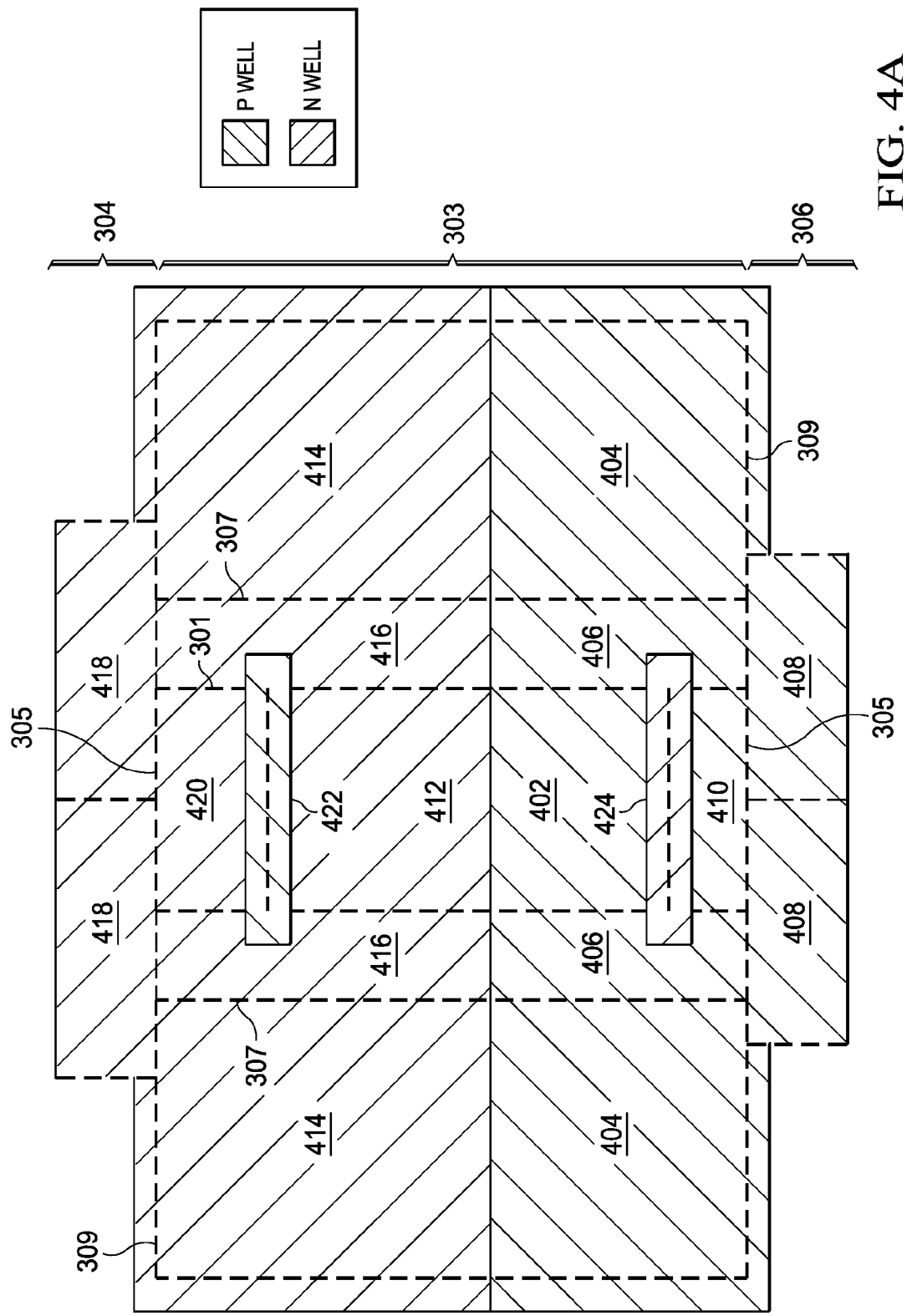
Figure 4B:
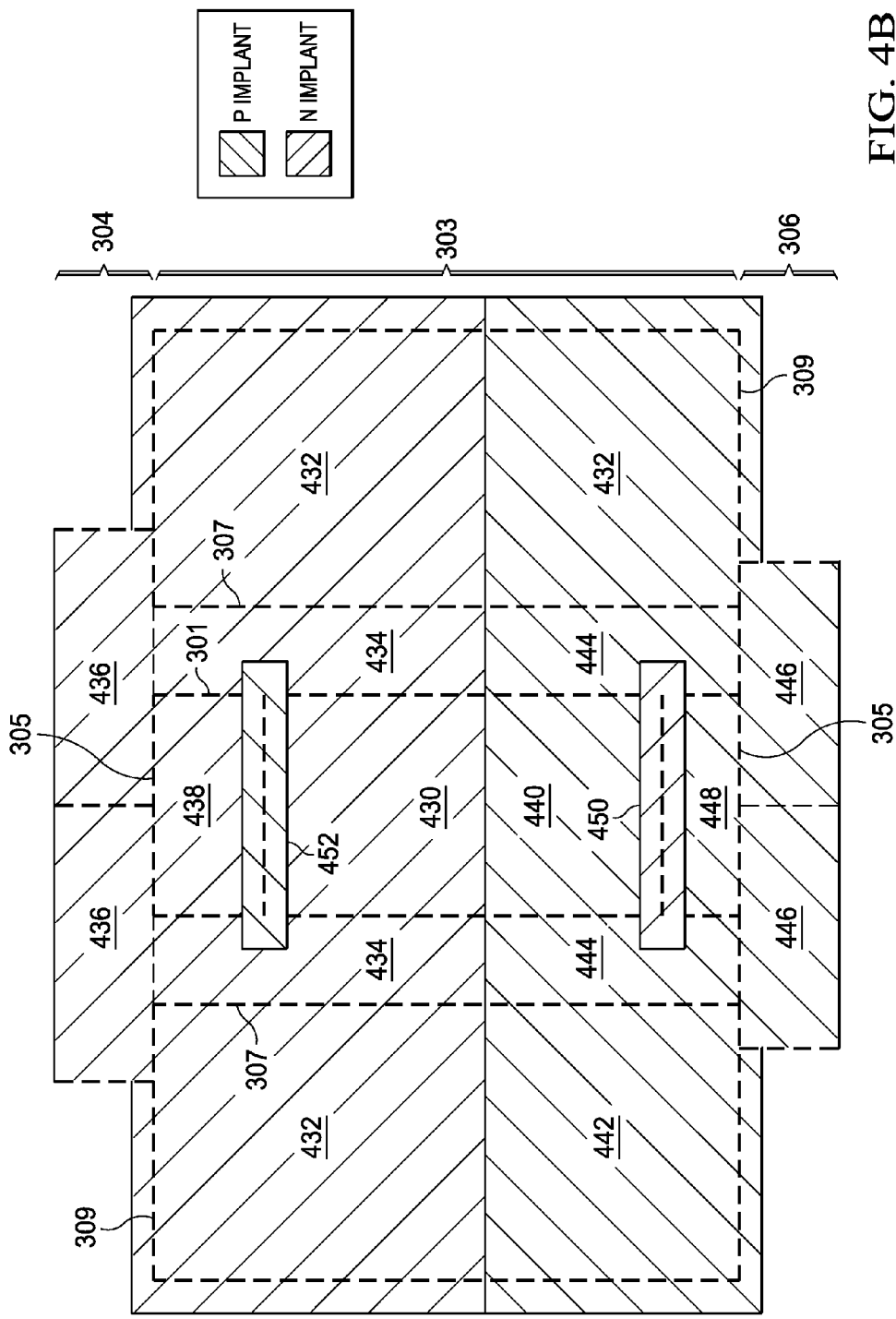
Figure 4C:
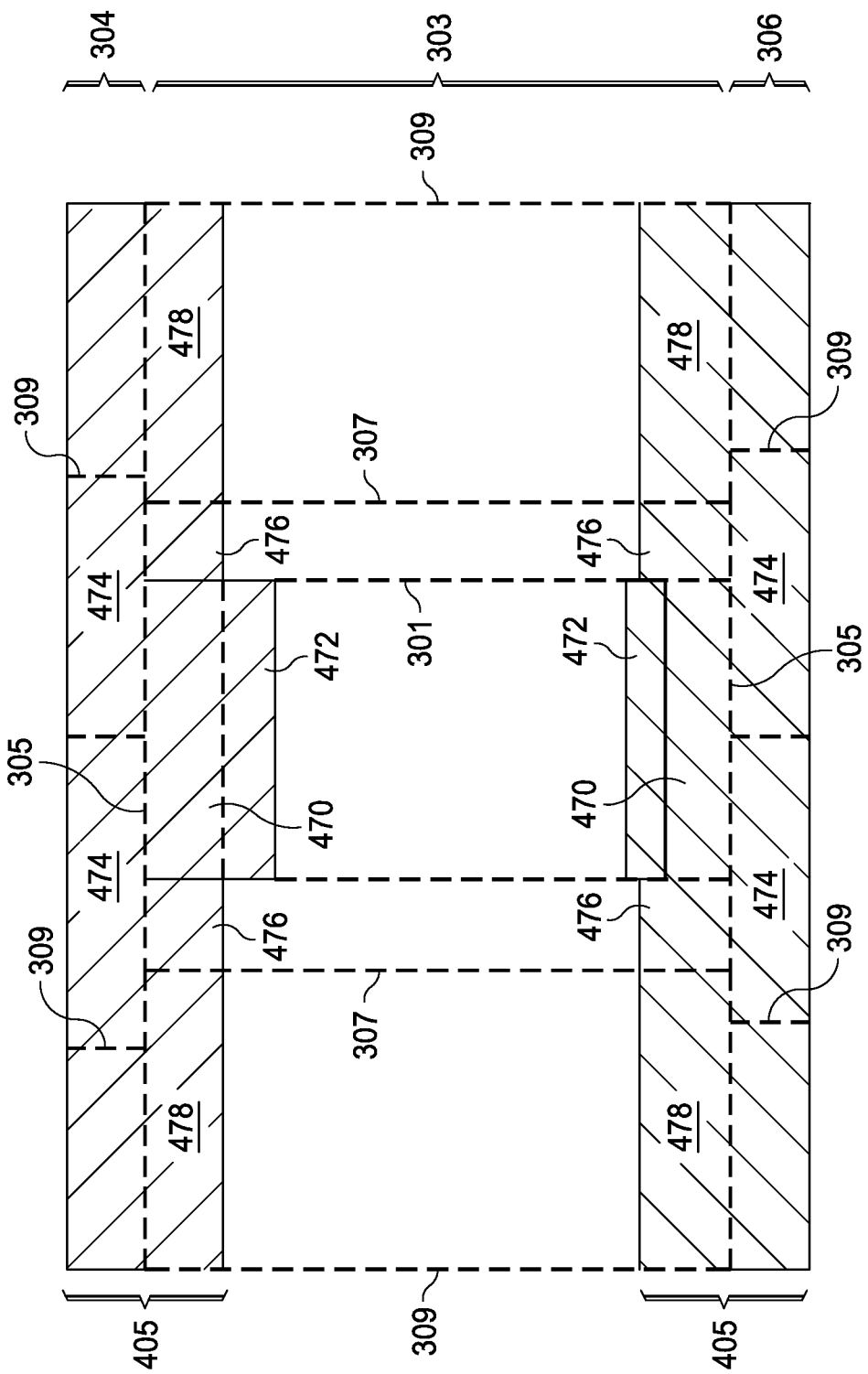
Figure 4D:
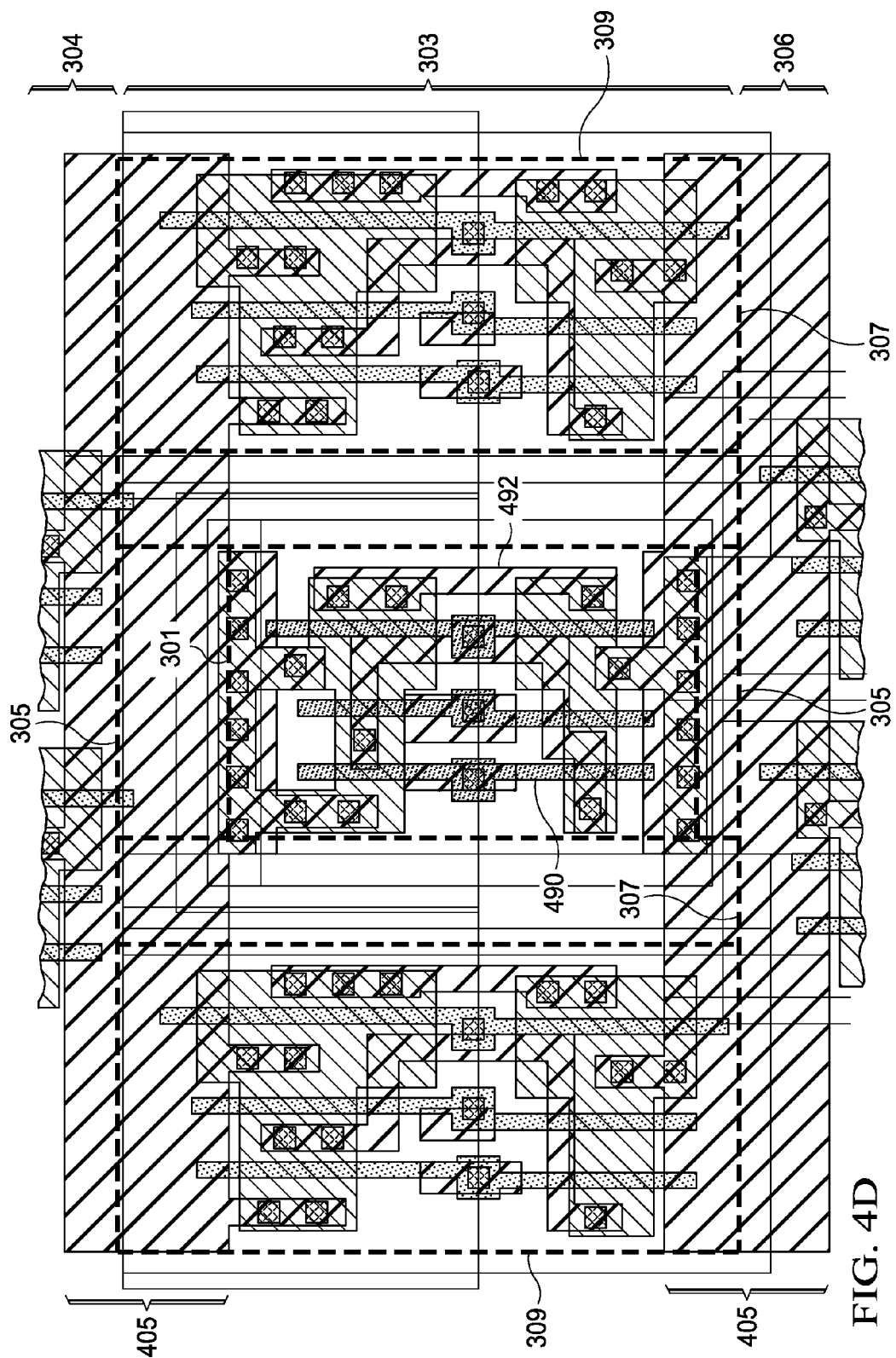
Figure 5:
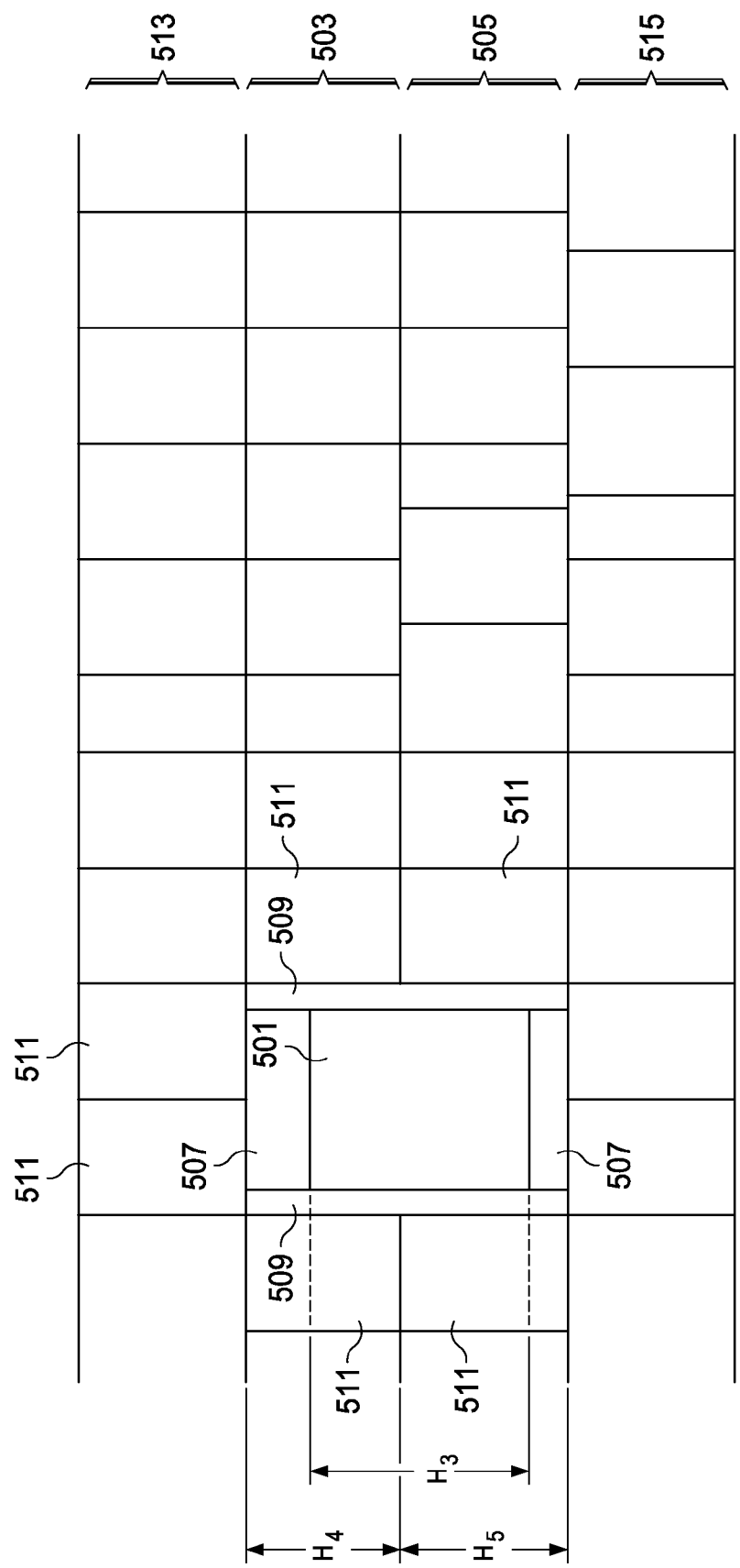
FIGS. 5 and 6A-6D illustrate the placement of a large cell into a smaller cell row in accordance with an embodiment of the present invention.
Figure 6A:
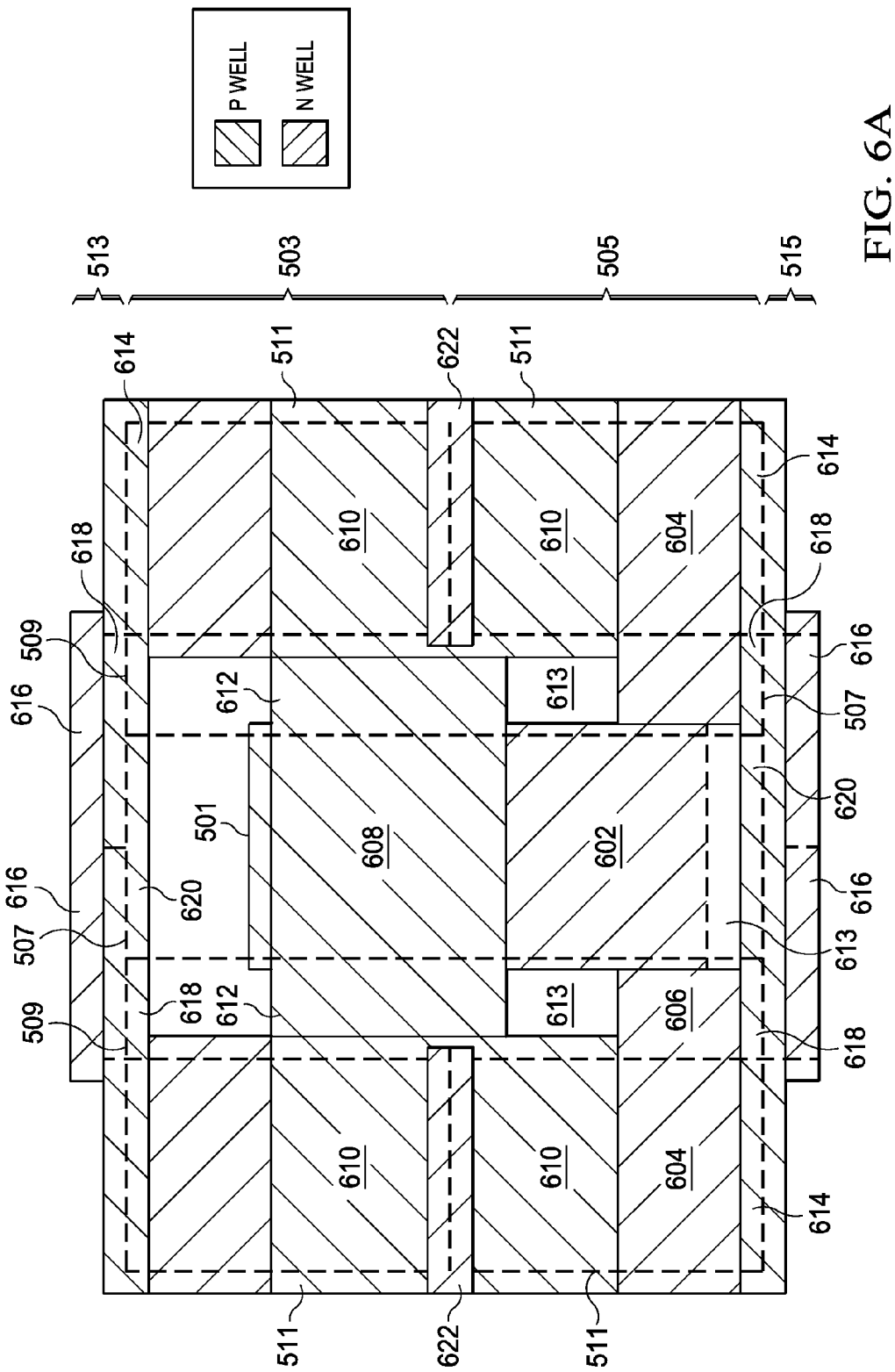
Figure 6B:
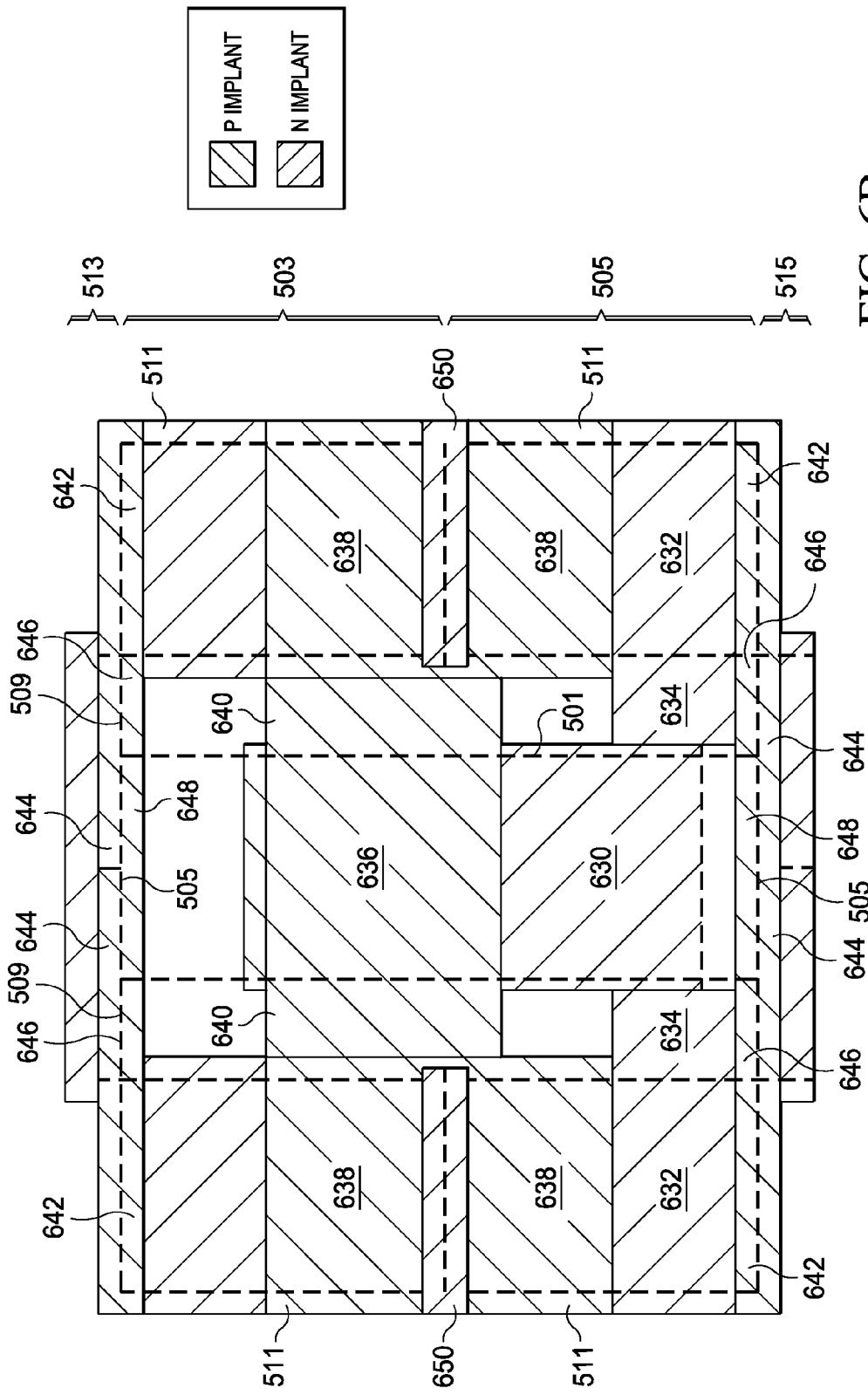
Figure 6C:
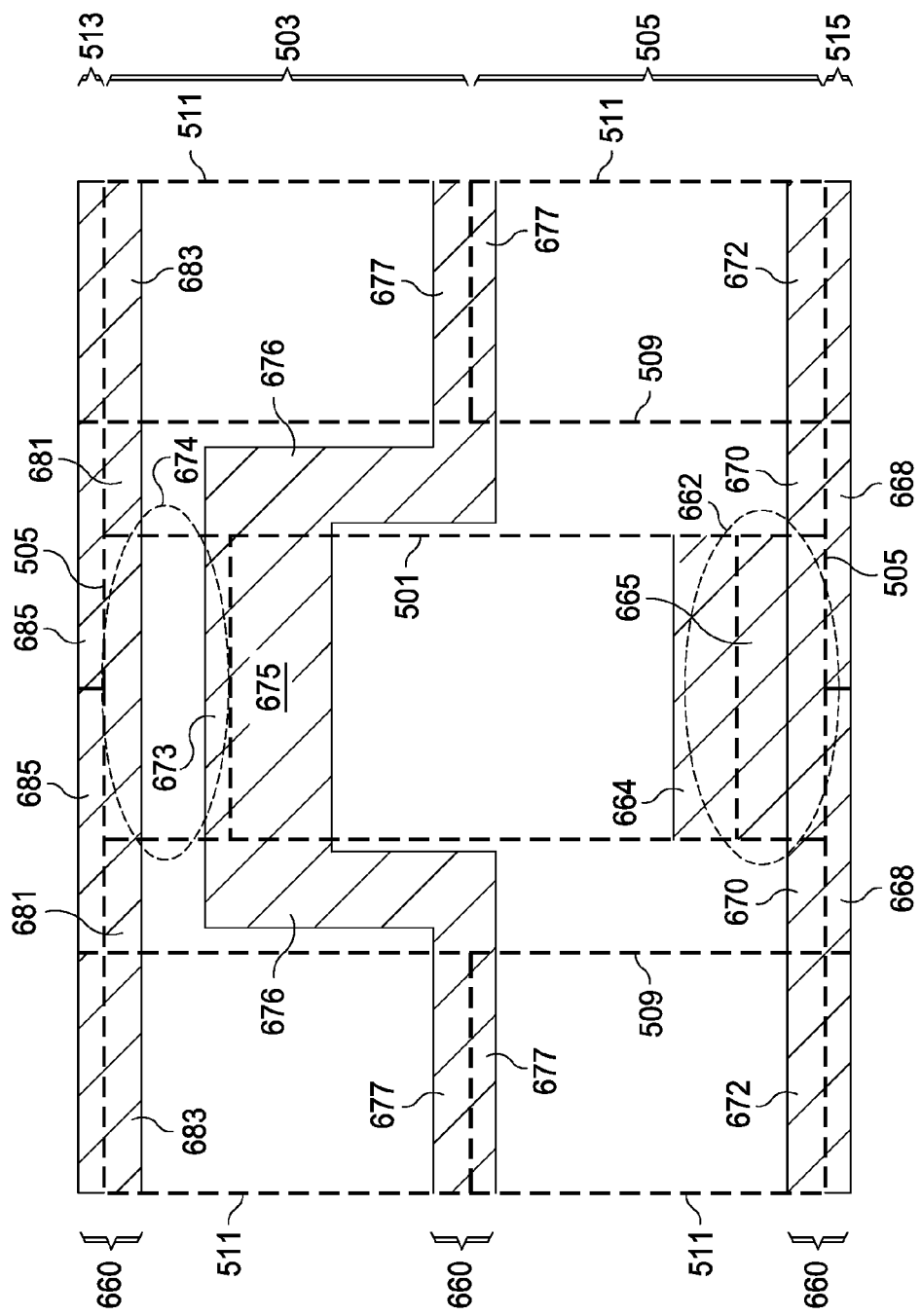
Figure 6D:
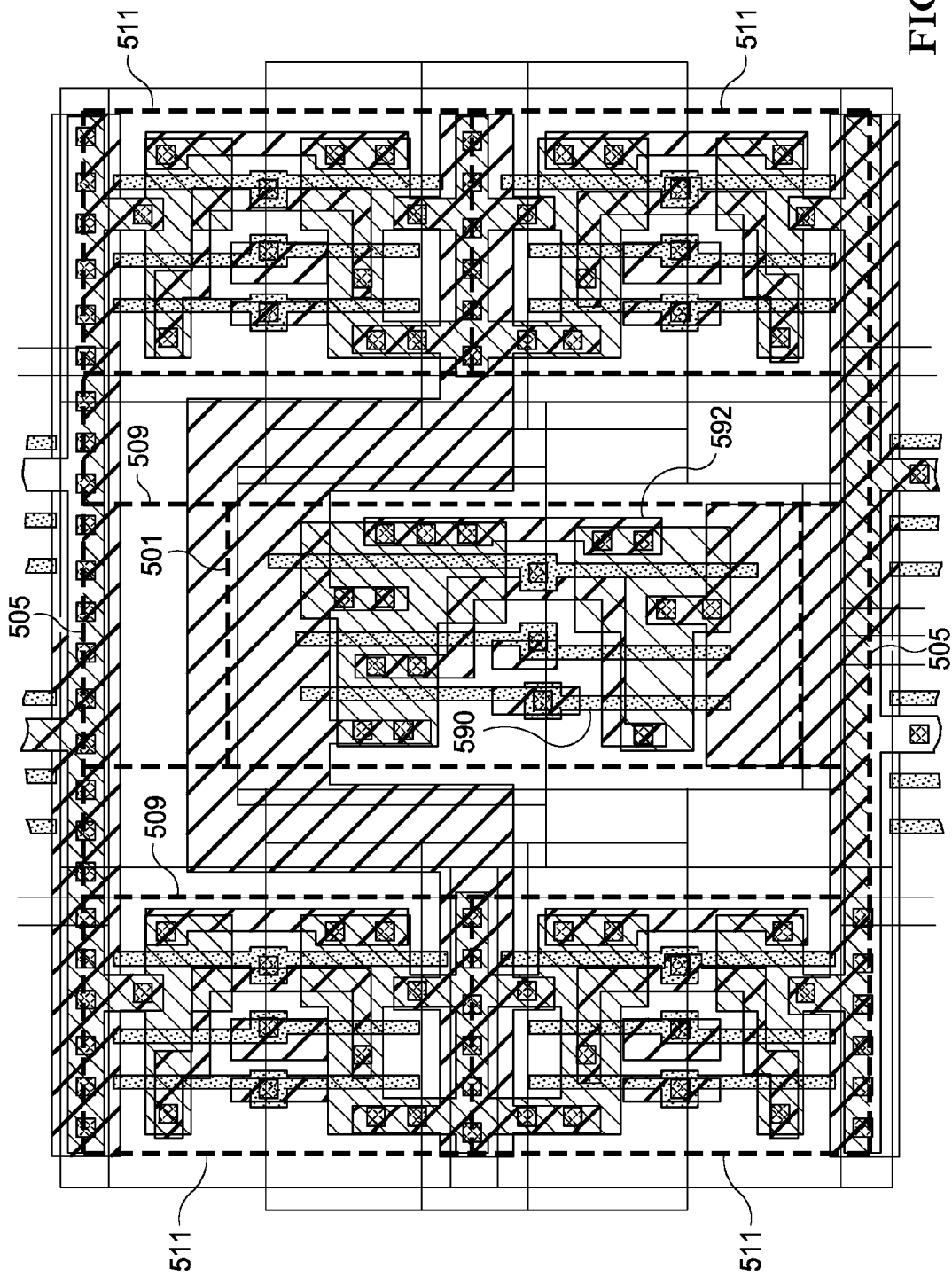

As illustrated in FIGS. 3-6D, an embodiment of the present invention allows a cell of any desired cell height to be included in any cell row regardless of the respective heights of the cell and the cell row. For example, FIGS. 3-4D illustrate an embodiment in which a first cell 301 with a first cell height $h_1$ smaller than a second height $h_2$ of the cell row 303 may nevertheless be placed into the cell row 303, and FIGS. 5-6D illustrate an embodiment in which a second cell 401 with a third cell height $h_3$ larger than a height $h_4$ of the fourth cell row 403 may also be included within the fourth cell row 403. Each of these embodiments are discussed further in the following paragraphs.

Referring first to FIGS. 3-4D, FIG. 3 illustrates an embodiment in which a first cell 301, with a first cell height $h_1$, is placed into a first cell row 303 with a larger second cell height $h_2$. The first cell row 303 is also adjacent to a second cell row 304 and a third cell row 306. In this embodiment, the first cell 301 may have a first cell height $h_1$ of between about 7 tracks and about 12 tracks, such as about 9 tracks, and a first width $w_1$ between about 4 tracks and about 24 tracks, such as about 6 tracks. Additionally, the first cell row 303 may have a second cell height $h_2$ between about 7 tracks and about 12 tracks, such as about 12 tracks. However, while these represent one embodiment of the present invention, the first cell height $h_1$ may be any suitable height as long as it is different from the second cell height $h_2$ or an integer multiple of the second cell height $h_2$ (such as twice the size of the second cell height $h_2$).

In this embodiment, first vertical fillers 305 are utilized in order to "fill" the remaining area between the first cell 301 and the second height $h_2$ of the cell row 303. Two first vertical fillers 305 may be utilized in order to fill the area above and below the first cell 301, with each of the first vertical fillers 305 having a height such that their total height makes up the difference between the second height $h_2$ of the cell row 303 and the first height $h_1$ of the first cell 301. Additionally, while the two first vertical fillers 305 may have the same height as each other, such a case is not required, and each of the first vertical fillers 305 may also have different heights, as long they make up the difference between the second height $h_2$ of the cell row 303 and the first height $h_1$ of the first cell 301. For example if the first cell height $h_1$ is about 9 tracks and the second cell height $h_2$ is 12 tracks, then the combined height of the first vertical fillers 305 would be 3 tracks, in order to extend the first cell height $h_1$ to the second height $h_2$ for the first cell row 303.

Additionally, if desired, first horizontal fillers 307 may also be utilized in order to "fill" the space between the first cell 301 and adjacent cells (e.g., cells 309) which, while shown as having a cell height equal to the second height $h_2$ of the first cell row 303, may alternatively have a different height than the second height $h_2$ of the first cell row 303. In an embodiment, the first horizontal fillers may have a second width $w_2$ of between about 1 track and about 3 tracks, such as about 1 track. The first vertical fillers 305 and first horizontal fillers 307 are used to engage the power rails, implants and wells of the first cell 301 to the power rail, implants, and wells, respectively, of the adjacent cells 309, as more fully described below with respect to FIGS. 4A-4C.

The definition of the first vertical fillers 305 and the first horizontal fillers 307 may be stored along with the first cell 301 in one of the cell libraries (e.g., cell library A 207, cell library B 209, or cell library C 211 in FIG. 2). Alternatively, definitions of the first vertical fillers 305 and first horizontal fillers 307 may be stored outside of the cell libraries in a suitable medium (such as part of the EDA program), and the first vertical fillers 305 and first horizontal fillers 307 may be combined with the first cell 301 by EDA during the generation of the first cell row 303. Any suitable combination of storage mediums may be utilized to combine the first vertical fillers 305 and first horizontal fillers 307 with the first cell 301 in order to place the first cell 301 into the first cell row 303.

FIGS. 4A-4D illustrate in greater detail the structural relationship of the first vertical fillers 305 and the first horizontal fillers 307. FIG. 4A illustrates the connection of p-wells and n-wells between the first cell 301 and adjacent cells 309, while FIG. 4B illustrates the connection of p-implants and n-implants (that are formed within the n-wells and p-wells, respectively) between the first cell 301 and adjacent cells 309. FIG. 4C, in moving away from the implanted regions located within the substrate, illustrates the connection of the first cell's 301 power rails to the power rails of the surrounding adjacent cells 309 without redesigning the entire first cell row 303. FIG. 4D illustrates an overhead structural view of the first cell 301. These connections are described in greater detail in the following paragraphs.

Referring first to FIG. 4A, FIG. 4A illustrates in greater detail than FIG. 3 the way in which a first p-well 402 located within the first cell 301 is connected to second p-wells 404 located in adjacent cells 309 of the first cell row 303. The first p-well 402 is connected to the second p-wells 404 through third p-wells 406 located in the first horizontal fillers 307. The first p-well 402 may additionally be electrically connected to fourth p-wells 408 located in the third cell row 306 by a fifth p-well 410 located in the vertical fillers 305 adjacent to the third cell row 306.

A first n-well 412 located within the first cell 301 is connected to second n-wells 414 located in adjacent cells 309 of the first cell row 303. The first n-well 412 is connected to the second n-wells 414 through third n-wells 416 located in the horizontal fillers 307. The first n-well 412 may additionally be electrically connected to fourth n-wells 418 located in the second cell row 304 by fifth n-wells 420 located in the vertical filler 305 adjacent to the second cell row 304.

Additionally, the horizontal filler 307 and the vertical filler 305 may be utilized to expand a sixth p-well 422 located with the first n-well 412 at the edge of the first cell 301. Similarly, the horizontal filler 307 and the vertical filler 305 may also be utilized to expand a sixth n-well 424 located with the first p-well 402 at the edge of the first cell 301. These expansions allow for more flexibility to form contacts and also to meet design rules.

FIG. 4B illustrates in greater detail than FIG. 3 the way in which a first p-implant 430 located within the first cell 301 is connected to second p-implants 432 located in adjacent cells 309 of the first cell row 303. The first p-implant 430 is connected to the second p-implants 432 through third p-implants 434 located in the horizontal fillers 307. The first p-implant 430 may additionally be electrically connected to fourth p-implants 436 located in the second cell row 304 by a fifth p-well 438 located in the vertical fillers 305 adjacent to the second cell row 304.

A first n-implant 440 located within the first cell 301 is connected to second n-implants 442 located in adjacent cells 309 of the first cell row 303. The first n-implant 440 is connected to the second n-implants 442 through third n-implants 444 located in the horizontal fillers 307. The first n-implants 440 may additionally be electrically connected to fourth n-implants 446 located in the third cell row 306 by fifth n-implants 448 located in the vertical filler 305 adjacent to the third cell row 306.

Additionally, the horizontal filler 307 and the vertical filler 305 may be utilized to expand a sixth p-implant 450 located within the first n-implant 440 at the edge of the first cell 301. Similarly, the horizontal filler 307 and the vertical filler 305 may also be utilized to expand a sixth n-implant 452 located with the first p-implant 430 at the edge of the first cell 301. These expansions allow for more flexibility to form contacts and also to meet design rules.

FIG. 4C illustrates in greater detail than FIG. 3 the first cell's 301 connections to power rails 405 that are shared between the first cell row 303 and adjacent cell rows (e.g., the second cell row 304 and the third cell row 306). Generally, if the first cell 301 had the same cell height as the adjacent cells 309 in the first cell row 303, then the first cell 301, and the adjacent cells 309 (including both the adjacent cells 309 in the first cell row 303 as well as adjacent cells 309 in the second cell row 304 and the third cell row 306) would form a continuous power rail 405 that may be in a straight line (although other shapes may be utilized depending upon the overall design). However, because the first cell 301 has a cell height $h_1$ different from the height $h_2$ of the second cell row 304, a gap in the continuous power rail 405 would occur without the presence of the first vertical fillers 305 and the first horizontal fillers 307 filling in the design in order to maintain the continuous nature of the power rails 405 and avoid having to redesign the power rails 405.

To do this, first power connections 470 located in the first vertical fillers 305 connect second power connections 472 located within the first cell 301 to third power connections 474 located in adjacent cells 309 in adjacent cell rows (e.g., the second cell row 304 and the third cell row 306). Additionally, fourth power connections 476 located in the first horizontal fillers 307 connect the first power connections 470 with fifth power connections 478 located in adjacent cells 309 in the first cell row 303. In this fashion the first vertical fillers 305 and first horizontal fillers 307 may be used to not only fill in the power rail 405 that would have occurred without the presence of the smaller first cell 301, but also ensures a connection between the second power connections 472 of the first cell 301 and the power rails 405 of the first cell row 303 without requiring a full-blown redesign of the power rails 405 in order to accommodate the height $h_1$ of the first cell 301.

FIG. 4D illustrates a structural overhead version of FIG. 4C, in which interior structures of the first cell 301 are visible. As illustrated, gate electrodes 490 and metal connections 492 form and connect structural components located within the first cell 301. However, as in FIG. 4C, FIG. 4D also illustrates how the first vertical fillers 305 and the first horizontal fillers 307 connect the first cell 301 to the power rails 405.

FIG. 5 illustrates another embodiment of the present invention in which a second cell 501 with a third height $h_3$ is placed into two or more adjacent cell rows, such as a fourth cell row 503 and a fifth cell row 505. A sixth cell row 513 is adjacent the fourth cell row 503 and a seventh cell row 515 is adjacent the fifth cell row 505. In this embodiment, the fourth height $h_4$ of the fourth cell row 503 and the fifth height $h_5$ of the fifth cell row 505 may be the same, or else, alternatively, they may be different from each other. However, in this embodiment, the third height $h_3$ of the second cell 501 is larger than at least one of the fourth height $h_4$ of the fourth cell row 503 or the fifth height $h_5$ of the fifth cell row 505. For example, the third height $h_3$ of the second cell 501 may be between about 7 tracks and about 12 tracks, such as about 12 tracks, while the fourth height $h_4$ of the fourth cell row 503 and the fifth height $h_5$ of the fifth cell row 505 may each be between about 7 tracks and about 12 tracks, such as about 9 tracks.

Similar to the embodiment discussed above with respect to FIG. 3, second vertical fillers 507 and second horizontal fillers 509 may be used to connect the second cell 501 with the power rails, implants, and wells in adjacent cells 511 in the fourth cell row 503 and the fifth cell row 505. The second vertical fillers 507 and second horizontal fillers 507 allow the EDA to better place the second cell 501 into the fourth cell row 503 and the fifth cell row 505 without having to completely redesign the fourth cell row 503 and the fifth cell row 505.

FIGS. 6A-6D illustrate in greater detail the structural relationship of the second vertical fillers 507 and the second horizontal fillers 509. FIG. 6A illustrates the connection of p-wells and n-wells between the second cell 501 and adjacent cells 511, while FIG. 6B illustrates the connection of p-implants and n-implants (that are formed within the n-wells and p-wells, respectively) between the second cell 501 and adjacent cells 511. FIG. 6C illustrates the connection of the second cell's 501 power rails to the power rails of the surrounding adjacent cells 511 without redesigning the fourth cell row 503 and the fifth cell row 505. These connections are described in greater detail in the following paragraphs.

Referring first to FIG. 6A, FIG. 6A illustrates in greater detail than FIG. 5 the way in which a seventh p-well 602 located within the second cell 501 is connected to eighth p-wells 604 located in adjacent cells 511 located in the fifth cell row 505. The seventh p-well 602 is connected to the eighth p-wells 604 through ninth p-wells 606 located in the second horizontal fillers 509. The ninth p-wells 606, while shown as being in a stair-step shape in FIG. 6A, may be any shape that allows for effective electrical connection between the seventh p-well 602 and the eighth p-wells 604 while still allowing for electrical connection between a sixth n-well 608 located within the second cell 501 and seventh n-wells 610 located in adjacent cells 511 of both the fifth cell row 505 and the fourth cell row 503.

The sixth n-well 608 is connected to the seventh n-wells 610 through ninth n-wells 612 located within the second horizontal fillers 509. The stair step shape of the ninth n-wells 612 as shown in FIG. 6A allows the ninth n-wells 612 to connect the sixth n-well 608 in the second cell 501 to the seventh n-wells 610 of adjacent cells 511 in both the fourth cell row 503 and the fifth cell row 505, while also leaving area 613 free of wells. However, any suitable shape of the ninth n-wells 612 within the second horizontal fillers 509 may be alternatively utilized to connect the seventh n-wells 610 to the sixth n-well 608.

Additionally, tenth n-wells 614 located in adjacent cells 511 in the fourth cell row 503 and the fifth cell row 505 may be connected to eleventh n-wells 616 in adjacent cells 511 in the sixth cell row 513 and seventh cell row 515, respectively. Such connections may be made using twelfth n-wells 618 located in the second horizontal fillers 509 and thirteenth n-wells 620 located in the second vertical filler 507. The second horizontal fillers 509 may also be used to expand tenth p-wells 622 that are located between adjacent cell 511 of the fourth cell row 503 and the fifth cell row 505. Expanding the tenth p-wells 622 allows for greater flexibility of design to meet design rules.

FIG. 6B illustrates in greater detail than FIG. 5 the way in which a seventh n-implant 630 located within the second cell 501 is connected to eighth n-implants 632 located in adjacent cells 511 located in the fifth cell row 505. The seventh n-implant 630 is connected to the eighth n-implants 632 through ninth n-implants 634 located in the second horizontal fillers 509. The ninth n-implants 634, while shown as being in a stair-step shape in FIG. 6B, may be any shape that allows for effective electrical connection between the seventh n-implant 630 and the eighth n-implants 632 while still allowing for electrical connection between a sixth p-implant 636 located within the second cell 501 and seventh p-implants 638 located in adjacent cells 511 of both the fifth cell row 505 and the fourth cell row 503.

The sixth p-implant 636 is connected to the seventh p-implants 638 through ninth p-implants 640 located within the second horizontal fillers 509. The stair step shape of the ninth p-implants 640 as shown in FIG. 6B allows the ninth p-implants 640 to connect the sixth p-implant 636 in the second cell 501 to the seventh p-implants 638 of adjacent cells 511 in both the fourth cell row 503 and the fifth cell row 505. However, any suitable shape of the ninth p-implants 640 within the second horizontal fillers 509 may be alternatively utilized to connect the seventh p-implants 638 to the sixth p-implant 636.

Additionally, tenth p-implants 642 located in adjacent cells 511 in the fourth cell row 503 and the fifth cell row 505 may be connected to eleventh p-implants 644 in adjacent cells 511 in the sixth cell row 513 and seventh cell row 515, respectively. Such connections may be made using twelfth p-implants 646 located in the second horizontal fillers 509 and thirteenth p-implants 648 located in the second vertical filler 507. The second horizontal fillers 509 may also be used to expand tenth n-implants 650 that are located between adjacent cells 511 of the fourth cell row 503 and the fifth cell row 505. Expanding the tenth n-implants 650 allows for greater flexibility of design to meet design rules.

FIG. 6C illustrates in greater detail than FIG. 5 the connection of the second cell 501 to the power rails 660 formed by the adjacent cells 511 in the fourth cell row 503, the fifth cell row 505, the sixth cell row 513, and the seventh cell row 515. As illustrated, the adjacent cells 511 form power rails 660 that are essentially continuous lines. However, the continuation of the power rails 660 as they are formed by the adjacent cells 511 into the second cell 501 would interfere with the layout of the second cell 501 and require a redesign of either the second cell 501 or the power rails 660.

To avoid this problem, the second horizontal fillers 509 and the second vertical fillers 507 are utilized to alter the routing of the power rails 660 around just the second cell 501 without altering its design anywhere else. For example, as shown in FIG. 6C, a sixth power connection 665 located in one of the second vertical fillers 507 (e.g., the one circled by dashed line 662), may connect a seventh power connection 664 located within the second cell 501 to eighth power connections 668 located in adjacent cells 511 in the seventh cell row 515. Additionally, ninth power connections 670 in the second horizontal fillers 509 may be used to connect the sixth power connection 665 in the second vertical filler 507 with tenth power connections 672 in adjacent cells 511 in the fifth cell row 505, to complete the power rail 660 between the fifth cell row and the seventh cell row 515.

An eleventh power connection 673 located in the other second vertical filler 507 (e.g., the second vertical filler circled by dashed line 674) may be used to expand a twelfth power connection 675 located within the first cell 501 towards the power rail 660 located between the fourth cell row 503 and the sixth cell row 513 without actually connecting the twelfth 507 power connection to the power rail 660 so located. Instead, the eleventh power connection 673 also extends laterally to connect to thirteenth power connectors 676 located within the second horizontal fillers 509. The thirteenth power connectors 676 then connect the eleventh power connection 673 and the twelfth power connection 675 to fourteenth power connectors 677 located between adjacent cells 511 of the fourth cell row 503 and the fifth cell row 505. While the thirteenth power connectors 676 may perform this routing using a stair-step shape as illustrated in FIG. 6C, any suitable shape may alternatively be utilized as long as a redesign of the power rails 660 outside of the second cell 501, second horizontal fillers 509, and second vertical fillers 507 is not required.

Additionally, while the twelfth power connection 675 is not extended by the eleventh power connection 673 in the second vertical filler 507 (e.g., the second vertical filler 507 circled by dashed line 674), a fifteenth power connector 679 in the second vertical filler 507 may be used along with sixteenth power connectors 681 in the second horizontal fillers 509 in order to connect seventeenth power connectors 683 in the adjacent cells 511 of the fourth cell row 503 with eighteenth power connectors 685 in the adjacent cells 511 of the sixth row 513. In this fashion, no redesign of the power rail 660 located between the fourth cell row 503 and the sixth cell row 513 is needed.

FIG. 6D illustrates a structural overhead view of FIG. 6C, in which interior structures of the second cell 501 and adjacent cells 511 are visible. As illustrated, gate electrodes 590 and metal connections 592 form and connect structural components located within the second cell 501. As in FIG. 6C, FIG. 6D also illustrates how the second vertical fillers 507 and the second horizontal fillers 509 connect the second cell 501 to the power rails 660.

By utilizing vertical fillers and horizontal fillers, the EDA is not limited to placing cells of a particular height into a cell row. As such, the EDA is not forced to make the compromise between performance and power consumption that is usually required when the cell heights are required to match the cell row. Consequently, a faster design that uses less power and is less complicated to manufacture may be designed by the EDA.

Although the present invention and its advantages have been described in detail, it should be understood that various changes, substitutions and alterations can be made herein without departing from the spirit and scope of the invention as defined by the appended claims. For example, the types of implantation (p-type or n-type) may be changed from the presented embodiments while remaining within the scope of the present invention. As another example, it will be readily understood by those skilled in the art that cell sizes and fillers may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit comprising:
   a first plurality of cells located in a first row, the first row having a first height;
   a first cell of the first plurality of cells, wherein the first cell has a second height different from the first height and different from an integer multiple of the first height; and
   one or more extension regions located adjacent the first cell, the one or more extension regions connecting well regions of the first cell and implant regions different from the well regions of the first cell to adjacent cells, the one or more extension regions further comprising an implant extension extending across and beyond a first side of the first cell, the implant extension having a different conductivity than a well region that is adjacent to the one or more extension regions in a first direction, the first direction being parallel with a longitudinal axis of the first row.

2. The integrated circuit of claim 1, wherein the second height is less than the first height.

3. The integrated circuit of claim 2, further comprising a second plurality of cells in a second row adjacent to the first row, wherein the one or more extension regions connect implant regions in the first cell to implant regions in one or more cells of the second plurality of cells.

4. The integrated circuit of claim 1, wherein the second height is larger than the first height.

5. The integrated circuit of claim 4, further comprising a second plurality of cells located in a second row adjacent to the first row, wherein the one or more extension regions extend the height of the first cell to the combined height of the first row and the second row.

6. The integrated circuit of claim 5, wherein the one or more extension regions connect implants with a first conductivity type in the first cell to implants with the same conductivity type in a third cell and a fourth cell, the third cell being located in the first row and the fourth cell being located in the second row.

7. An integrated circuit comprising:
   a first cell row with a first cell row height;
   a second cell row with a second cell row height;
   a first cell extending into both the first cell row and the second cell row, the first cell having a first cell height that is less than a sum of the first cell row height and the second cell row height, wherein the first cell height is a non-integer multiple of the first cell row height; and
   a first filler region extending from the first cell to an edge of the first cell row, the first filler region connecting the first cell to a second cell adjacent to the first cell, the first filler region comprising a well with a stair step shape.

8. The integrated circuit of claim 7, wherein the first filler region connects implant regions within the first cell to implant regions within the second cell.

9. The integrated circuit of claim 8, wherein the second cell is located in the first cell row.

10. The integrated circuit of claim 8, wherein the second cell is located in a third cell row, the third cell row being adjacent to the first cell row.

11. The integrated circuit of claim 8, wherein the first filler region connects power rails within the first cell to power rails within the second cell.

12. The integrated circuit of claim 8, wherein the first filler region connects wells within the first cell to wells within the second cell.

13. The integrated circuit of claim 8, further comprising a second filler region extending away from the first cell in a direction parallel with the edge of the first cell row, the second filler connecting the first cell to a third cell adjacent to the first cell.

14. The integrated circuit of claim 13, wherein the second filler region connects implants with a first conductivity type in the first cell to implants with the same conductivity type in the third cell and a fourth cell, the third cell being located in the first cell row and the fourth cell being located in the second cell row.

15. An integrated circuit comprising:
   a first cell located in a first cell row, wherein the first cell has a first height and the first cell row has a second height different from the first height and different from an integer multiple of the first height, the first cell comprising an implant region of a first conductivity type across one edge of the first cell, the implant region being adjacent to a well region having a different conductivity type; and
   a first extension region extending in a first direction away from the first cell, the first direction being perpendicular with an edge of the first cell row, the first extension region comprising a first implant extension having the first conductivity type and being adjacent to the implant region; and
   a second extension region extending in a second direction away from the first cell, the second direction being parallel with the edge of the first cell row, wherein the first extension region and the second extension region electrically connect the first cell to adjacent cells, the second extension region comprising a second implant extension having the first conductivity type and being adjacent to the implant region and the first implant extension.

16. The integrated circuit of claim 15, wherein the first height is less than the second height.

17. The integrated circuit of claim 15, wherein the first height is greater than the second height.

18. The integrated circuit of claim 15, wherein the first extension region and the second extension region connect power rails within the first cell to power rails in the adjacent cells.

19. The integrated circuit of claim 15, wherein the adjacent cells comprise a second cell in physical contact with the first extension region and a third cell in physical contact with the second extension region.

20. The integrated circuit of claim 15, further comprising a third extension region extending in a third direction away from the first cell, the third direction being different from the first direction and perpendicular with the edge of the first cell row.

* * * * *